US012701987B2

(12) United States Patent
Lee et al.

(10) Patent No.: US 12,701,987 B2
(45) Date of Patent: Aug. 4, 2026

(54) SEMICONDUCTOR DEVICES INCLUDING CONDUCTIVE STRUCTURES

(71) Applicant: Samsung Electronics Co., Ltd., Suwon-si (KR)

(72) Inventors: Doohyun Lee, Suwon-si (KR); Heonjong Shin, Suwon-si (KR); Seon-Bae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 536 days.

(21) Appl. No.: 18/095,080

(22) Filed: Jan. 10, 2023

(65) Prior Publication Data

US 2023/0402376 A1     Dec. 14, 2023

(30) Foreign Application Priority Data

Jun. 9, 2022    (KR) ......................... 10-2022-0070369

(51) Int. Cl.
H10D 84/83          (2025.01)
H10D 84/60          (2025.01)
(Continued)

(52) U.S. Cl.
CPC ........ H10W 20/435 (2026.01); H10D 84/645 (2025.01); H10D 84/83 (2025.01); H10W 20/42 (2026.01); H10W 20/47 (2026.01)

(58) Field of Classification Search
CPC ............... H01L 23/5226; H01L 23/528; H01L 21/76897; H01L 23/481; H01L 21/76877;
(Continued)

(56) References Cited

U.S. PATENT DOCUMENTS

| | | |
|---|---|---|
| 10,297,601 B2 | 5/2019 | Kim et al. |
| 10,600,884 B2 | 3/2020 | Bao et al. |

(Continued)

FOREIGN PATENT DOCUMENTS

| | | |
|---|---|---|
| KR | 100360151 B1 | 11/2002 |
| KR | 100824622 B1 | 4/2008 |

(Continued)

*Primary Examiner* — Kretelia Graham
*Assistant Examiner* — Hamna Fathima Iqbal
(74) *Attorney, Agent, or Firm* — Wolf, Greenfield & Sacks, P.C.

(57)          ABSTRACT

Semiconductor devices and fabrication methods thereof. For example, a semiconductor device may include a dielectric structure, and first conductive structures and second conductive structures. The dielectric structure may include a first dielectric layer that surrounds the first conductive structures and a second dielectric layer that surrounds the second conductive structures. The first dielectric layer may include a first intervention between the first conductive structures. The second dielectric layer may include a second intervention between the second conductive structures. A width in a first direction of the first intervention may decrease in a second direction from a top surface toward a bottom surface of the first intervention. A width in the first direction of the second intervention may increase in the second direction from a top surface toward a bottom surface of the second intervention. The first dielectric layer and the second dielectric layer may include different dielectric materials.

20 Claims, 14 Drawing Sheets

(51) Int. Cl.
   *H10W 20/41*     (2026.01)
   *H10W 20/42*     (2026.01)
   *H10W 20/47*     (2026.01)

(58) Field of Classification Search
   CPC .............. H01L 24/20; H01L 21/76804; H01L
                21/76802; H01L 2224/80896; H01L
                21/76843; H10D 84/645; H10D 84/83
   See application file for complete search history.

(56)              References Cited

U.S. PATENT DOCUMENTS

| | | | |
|---|---|---|---|
| 11,024,539 B2 | 6/2021 | Xie et al. | |
| 2003/0207585 A1* | 11/2003 | Choi ................. | H01L 21/31116 |
| | | | 257/E21.252 |
| 2004/0043618 A1* | 3/2004 | Hellig ............... | H01L 21/31116 |
| | | | 257/E21.252 |
| 2012/0025283 A1 | 2/2012 | Son et al. | |
| 2013/0277791 A1 | 10/2013 | Nassar et al. | |
| 2021/0111029 A1* | 4/2021 | Lu ........................ | H10D 64/667 |
| 2021/0384074 A1 | 12/2021 | Chen et al. | |
| 2023/0361069 A1* | 11/2023 | Ishikawa ................. | H01L 24/08 |

FOREIGN PATENT DOCUMENTS

| | | |
|---|---|---|
| KR | 101076780 B1 | 10/2011 |
| KR | 20130118256 A | 10/2013 |
| KR | 101660782 B1 | 9/2016 |
| KR | 10-2017-0052752 A | 5/2017 |
| KR | 10-2022-0073718 A | 6/2022 |

* cited by examiner

SEMICONDUCTOR DEVICES INCLUDING CONDUCTIVE STRUCTURES

CROSS-REFERENCE TO RELATED APPLICATION

This U.S. nonprovisional application claims priority under 35 U.S.C § 119 to Korean Patent Application No. 10-2022-0070369 filed on Jun. 9, 2022 in the Korean Intellectual Property Office, and the entire contents of the above-identified application are incorporated by reference herein.

TECHNICAL FIELD

The present inventive concepts relate to semiconductor devices, and more particularly, relate to semiconductor devices that include conductive structures.

BACKGROUND

Semiconductor devices are beneficial in the electronics industry because of their small size, multi-functionality, and/or low fabrication cost. Semiconductor devices may be categorized as any one of semiconductor memory devices storing logic data, semiconductor logic devices processing operations of logic data, and hybrid semiconductor devices having both memory and logic elements.

Recently, desired characteristics for electronic products of increased speed and reduced power consumption have resulted in corresponding demand for semiconductor devices to be used or embedded in the electronic products to exhibit higher operating speeds and/or lower operating voltage. On the other hand, an increase in integration of the semiconductor device may induce a reduction in electrical properties and a reduction in a production yield of the semiconductor device. Hence, many studies have been conducted to increase or improve electrical properties and production yields of semiconductor devices.

SUMMARY

Some embodiments of the present inventive concepts provide semiconductor devices with increased or improved reliability and/or increased or improved electrical properties.

According to some embodiments of the present inventive concepts, a semiconductor device may comprise: a dielectric structure; and first conductive structures and second conductive structures in the dielectric structure. The dielectric structure may include a first dielectric layer that surrounds the first conductive structures and a second dielectric layer that surrounds the second conductive structures. The first dielectric layer may include a first intervention in contact with and between the first conductive structures. The second dielectric layer may include a second intervention in contact with and between the second conductive structures. A width in a first direction of the first intervention may decrease in a second direction from a top surface of the first intervention toward a bottom surface of the first intervention. A width in the first direction of the second intervention may increase in the second direction from a top surface of the second intervention toward a bottom surface of the second intervention. The first dielectric layer and the second dielectric layer may include different dielectric materials from each other.

According to some embodiments of the present inventive concepts, a semiconductor device may include: a substrate;

a dielectric structure on the substrate; and first conductive structures and second conductive structures in the dielectric structure. The dielectric structure may include a first dielectric layer that surrounds the first conductive structures and a second dielectric layer that surrounds the second conductive structures. The first dielectric layer may include a first intervention between the first conductive structures. The second dielectric layer may include a second intervention between the second conductive structures. A width in a first direction of the first intervention may decrease with decreasing distance from a top surface of the substrate. A width in the first direction of the second intervention may increase with decreasing distance from the top surface of the substrate. The first dielectric layer and the second dielectric layer may include different dielectric materials from each other.

According to some embodiments of the present inventive concepts, a semiconductor device may comprise: a substrate that includes an active pattern; a source/drain region on the active pattern; a conductive structure connected to the source/drain region; and a dielectric structure that surrounds the conductive structure. The dielectric structure may include a first dielectric layer and a second dielectric layer that include different dielectric materials from each other. The conductive structure may include first conductive structures in the first dielectric layer and second conductive structures in the second dielectric layer. The first dielectric layer may include a first separation structure between the first conductive structures. The second dielectric layer may include a second separation structure between the second conductive structures. A width in a first direction of each of the first conductive structures may increase with decreasing distance from the substrate. A width in the first direction of each of the second conductive structures may decrease with decreasing distance from the substrate. A width in the first direction of the first separation structure may decrease with decreasing distance from the substrate. A width in the first direction of the second separation structure may increase with decreasing distance from the substrate.

According to some embodiments of the present inventive concepts, a method of fabricating a semiconductor device may include: forming a preliminary dielectric layer that includes a first section and a second section; forming a dielectric pattern by etching the first section of the preliminary dielectric layer; forming a first dielectric layer that surrounds the dielectric pattern; forming a mask pattern on the second section of the preliminary dielectric layer; etching the dielectric pattern and the second section of the preliminary dielectric layer using the mask pattern and the first dielectric layer as etching masks, wherein the etching of the second section of the preliminary dielectric layer results in a second dielectric layer; forming a first conductive structure that is surrounded by the first dielectric layer; and forming a second conductive structure that is surrounded by the second dielectric layer.

BRIEF DESCRIPTION OF THE DRAWINGS

FIG. 3 illustrates a cross-sectional view showing a method of fabricating a semiconductor device according to some embodiments.

DETAILED DESCRIPTION

The following will describe in detail a semiconductor device and its fabrication method according to some embodiments of the present inventive concepts with reference to the accompanying drawings.

Figure 1A:
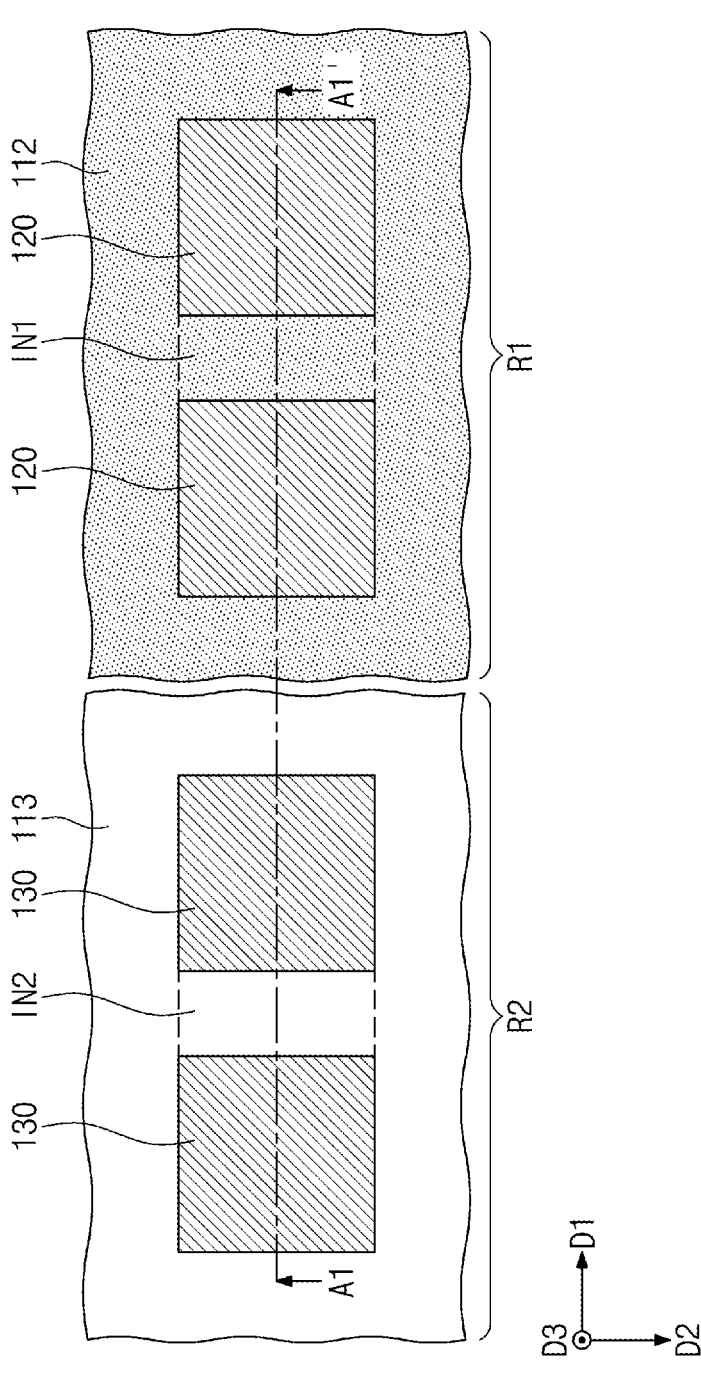
FIG. 1A illustrates a plan view showing a semiconductor device according to some embodiments.
Figure 1B:
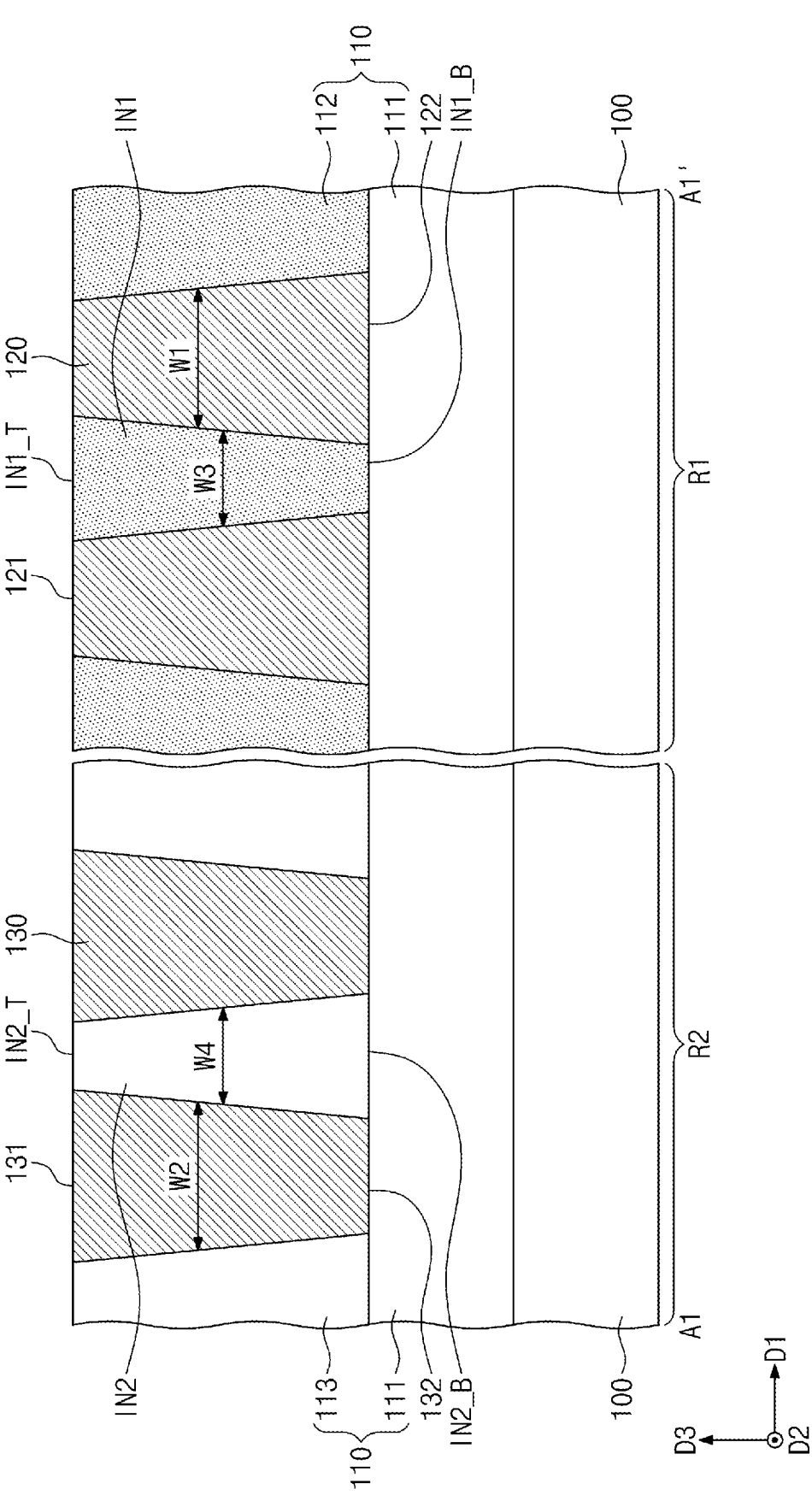
FIG. 1B illustrates a cross-sectional view taken along line A1-A1' of FIG. 1A.

FIG. 1A illustrates a plan view showing a semiconductor device according to some embodiments. FIG. 1B illustrates a cross-sectional view taken along line A1-A1' of FIG. 1A.

Referring to FIGS. 1A and 1B, a semiconductor device may include a first region R1 and a second region R2. As seen from the plan view of FIG. 1A, the first region R1 and the second region R2 may be divided areas that are elongated in a first direction D1 and a second direction D2. The first direction D1 and the second direction D2 may intersect each other. For example, the first direction D1 and the second direction D2 may be horizontal directions that are orthogonal to each other. The first region R1 and the second region R2 may be spaced apart from each other in the first direction D1.

The semiconductor device may include a substrate 100. In some embodiments, the substrate 100 may be a semiconductor substrate. For example, the substrate 100 may include silicon, germanium, silicon-germanium, GaP, or GaAs. In some embodiments, the substrate 100 may be a silicon-on-insulator (SOI) substrate or a germanium-on-insulator (GOI) substrate. The substrate 100 may have a plate shape that extends along a plane that is elongated in the first direction D1 and the second direction D2.

A dielectric structure 110 may be provided on the substrate 100. The dielectric structure 110 may include a lower dielectric layer 111, a first dielectric layer 112, and a second dielectric layer 113. The lower dielectric layer 111 may be provided on the substrate 100. The first dielectric layer 112 and the second dielectric layer 113 may be provided on the lower dielectric layer 111. The first dielectric layer 112 may be provided in the first region R1. The second dielectric layer 113 may be provided in the second region R2.

The lower dielectric layer 111 may include a dielectric material. For example, the lower dielectric layer 111 may include oxide. In some embodiments, the lower dielectric layer 111 may be a multi-layered structure that includes a plurality of dielectric layers. In some embodiments, the lower dielectric layer 111 may cover a semiconductor element (not shown) provided on the substrate 100, and the lower dielectric layer 111 may be provided therein with conductive structures (not shown) that are electrically connected to the semiconductor element. The semiconductor element may include, for example, at least one selected from transistors, capacitors, and resistors. The conductive structures in the lower dielectric layer 111 may include, for example, conductive contacts and/or conductive lines.

The first dielectric layer 112 and the second dielectric layer 113 may include different dielectric materials from each other. The first dielectric layer 112 may include a first dielectric material, and the second dielectric layer 113 may include a second dielectric material having an etch selectivity with respect to the first dielectric material. For example, the first dielectric material may be nitride or carbonitride, and the second dielectric material may be oxide. The first dielectric layer 112 may include a dielectric material different from that of the lower dielectric layer 111. The first dielectric material of the first dielectric layer 112 may have an etch selectivity with respect to a dielectric material included in the lower dielectric layer 111.

The first dielectric layer 112 and the second dielectric layer 113 may be located at the same level as each other. For example, the first and second dielectric layers 112 and 113 may have their bottom surfaces that are coplanar with each other and are an equal distance from the substrate 100 (e.g., from a top surface of the substrate 100). The first and second dielectric layers 112 and 113 may have their top surfaces that are coplanar with each other and are an equal distance from the substrate 100 (e.g., from the top surface of the substrate 100).

In some embodiments, the second dielectric layer 113 and the lower dielectric layer 111 may include the same dielectric material, and may be connected to constitute a single unitary structure with no boundary therebetween. Stated differently, the second dielectric layer 113 and the lower dielectric layer 111 may be integral with each other.

First conductive structures 120 may be provided in the first dielectric layer 112 of the dielectric structure 110. The first conductive structures 120 may be provided in the first region R1. The first conductive structures 120 may be surrounded by the first dielectric layer 112 of the dielectric structure 110. The first conductive structures 120 may extend in a third direction D3 and may extend through the first dielectric layer 112. The third direction D3 may intersect the first direction D1 and the second direction D2. For example, the third direction D3 may be a vertical direction that is perpendicular to the first direction D1 and the second direction D2. The first conductive structures 120 may include a conductive material.

The first conductive structures 120 may be provided on the lower dielectric layer 111. In some embodiments, the first conductive structure 120 may be connected to a conductive structure in the lower dielectric layer 111 (e.g., one or more of the conductive contacts and/or conductive lines discussed above), and may be electrically connected through the conductive structure in the lower dielectric layer 111 to a semiconductor element on the substrate 100 (e.g., one or more of the transistors, capacitors, and resistors discussed above). In some embodiments, the first conductive structures 120 may be provided on and directly connected to the substrate 100.

Second conductive structures 130 may be provided in the second dielectric layer 113 of the dielectric structure 110. The second conductive structures 130 may be provided in the second region R2. The second conductive structures 130 may be surrounded by the second dielectric layer 113 of the dielectric structure 110. The second conductive structures 130 may extend in the third direction D3 and may extend through the second dielectric layer 113. The second conductive structures 130 may include a conductive material.

The second conductive structures 130 may be provided on the lower dielectric layer 111. In some embodiments, the second conductive structure 130 may be connected to a conductive structure in the lower dielectric layer 111 (e.g., one or more of the conductive contacts and/or conductive lines discussed above), and may be electrically connected through the conductive structure in the lower dielectric layer 111 to the semiconductor element on the substrate 100 (e.g., one or more of the transistors, capacitors, and resistors discussed above). In some embodiments, the second conductive structures 130 may be provided on and directly connected to the substrate 100.

The first and second conductive structures 120 and 130 may be located at the same level, or an equal distance from the substrate 100 (e.g., a top or bottom surface of the substrate 100). The first and second conductive structures 120 and 130 may be located at the same level as that of the first and second dielectric layers 112 and 113. In some embodiments, the top surfaces of the first and second dielectric layers 112 and 113 may be coplanar with top surfaces 121 of the first conductive structures 120 and with top surfaces 131 of the second conductive structures 130. The bottom surfaces of the first and second dielectric layers 112 and 113 may be coplanar with bottom surfaces 122 of the first conductive structures 120 and with bottom surfaces 132 of the second conductive structures 130.

In some embodiments, the first and second conductive structures 120 and 130 may be conductive contacts. In some embodiments, the first and second conductive structures 120 and 130 may be conductive lines that extend in the second direction D2.

The first conductive structure 120 may have inclined sidewalls. The first conductive structure 120 may have a width that increases with decreasing distance from the substrate 100 and the lower dielectric layer 111. For example, a width W1 in the first direction D1 of the first conductive structure 120 may increase with decreasing distance from the substrate 100 (or a top surface thereof) and the lower dielectric layer 111. The width of the first conductive structure 120 may increase in a direction from the top surface 121 toward the bottom surface 122 of the first conductive structure 120. The first conductive structure 120 may have a width at the top surface 121 that is less than a width at the bottom surface 122. Stated differently, the first conductive structure 120 may be wider in the first direction D1 at the bottom surface 122 thereof than at the top surface 121 thereof.

The second conductive structure 130 may have inclined sidewalls. The second conductive structure 130 may have a width that decreases with decreasing distance from the substrate 100 and the lower dielectric layer 111. For example, a width W2 in the first direction D1 of the second conductive structure 130 may decrease with decreasing distance from the substrate 100 (or a top surface thereof) and the lower dielectric layer 111. The width of the second conductive structure 130 may decrease in a direction from the top surface 131 toward the bottom surface 132 of the second conductive structure 130. The second conductive structure 130 may have a width at the top surface 131 that is greater than a width at the bottom surface 132. Stated differently, the second conductive structure 130 may be wider in the first direction D1 at the top surface 131 thereof than at the bottom surface 132 thereof.

The first dielectric layer 112 may include a first intervention IN1 interposed between the first conductive structures 120. The first intervention IN1 may be a separation structure or insulating structure. The first intervention IN1 may be in contact with the first conductive structures 120 adjacent to each other. The first intervention IN1 may have opposite sidewalls that are correspondingly or respectively in contact with the sidewall of one of the first conductive structures 120 and with the sidewall of another of the first conductive structures 120. The sidewalls of the first intervention IN1 may be inclined corresponding to the sidewalls of the first conductive structure 120.

The first intervention IN1 may have a width that decreases with decreasing distance from the substrate 100. For example, a width W3 in the first direction D1 of the first intervention IN1 may decrease with decreasing distance from the substrate 100. The width of the first intervention IN1 may decrease in a direction from a top surface IN1_T toward a bottom surface IN1_B of the first intervention IN1. The first intervention IN1 may have a width at the top surface IN1_T that is greater than a width at the bottom surface IN1_B.

The second dielectric layer 113 may include a second intervention IN2 interposed between the second conductive structures 130. The second intervention IN2 may be a separation structure or insulating structure. The second intervention IN2 may be in contact with the second conductive structures 130 adjacent to each other. The second intervention IN2 may have opposite sidewalls that are correspondingly or respectively in contact with the sidewall of one of the second conductive structures 130 and with the sidewall of another of the second conductive structures 130. The sidewalls of the second intervention IN2 may be inclined corresponding to the sidewalls of the second conductive structure 130.

The second intervention IN2 may have a width that increases with decreasing distance from the substrate 100. For example, a width W4 in the first direction D1 of the second intervention IN2 may increase with decreasing distance from the substrate 100. The width of the second intervention IN2 may increase in a direction from a top surface IN2_T toward a bottom surface IN2_B of the second intervention IN2. The second intervention IN2 may have a width at the top surface IN2_T that is less than a width at the bottom surface IN2_B.

A semiconductor device according to some embodiments may be configured such that the widths of the first conductive structures 120 on the first region R1 may increase with decreasing distance from the substrate 100, and that the widths of the second conductive structures 130 on the second region R2 may decrease with decreasing distance from the substrate 100. Therefore, the first and second conductive structures 120 and 130 may have different shapes and sizes, and may induce or result in a difference in resistance and capacitance. As the first and second regions R1 and R2 that are different from each other are provided thereon with the first and second conductive structures 120 and 130 having different shapes and sizes, it may be possible to optimize electrical properties of the semiconductor device.

FIGS. 2A, 2B, 2C, and 2D illustrate cross-sectional views showing a method of fabricating the semiconductor device according to FIG. 1.

Figure 2A:
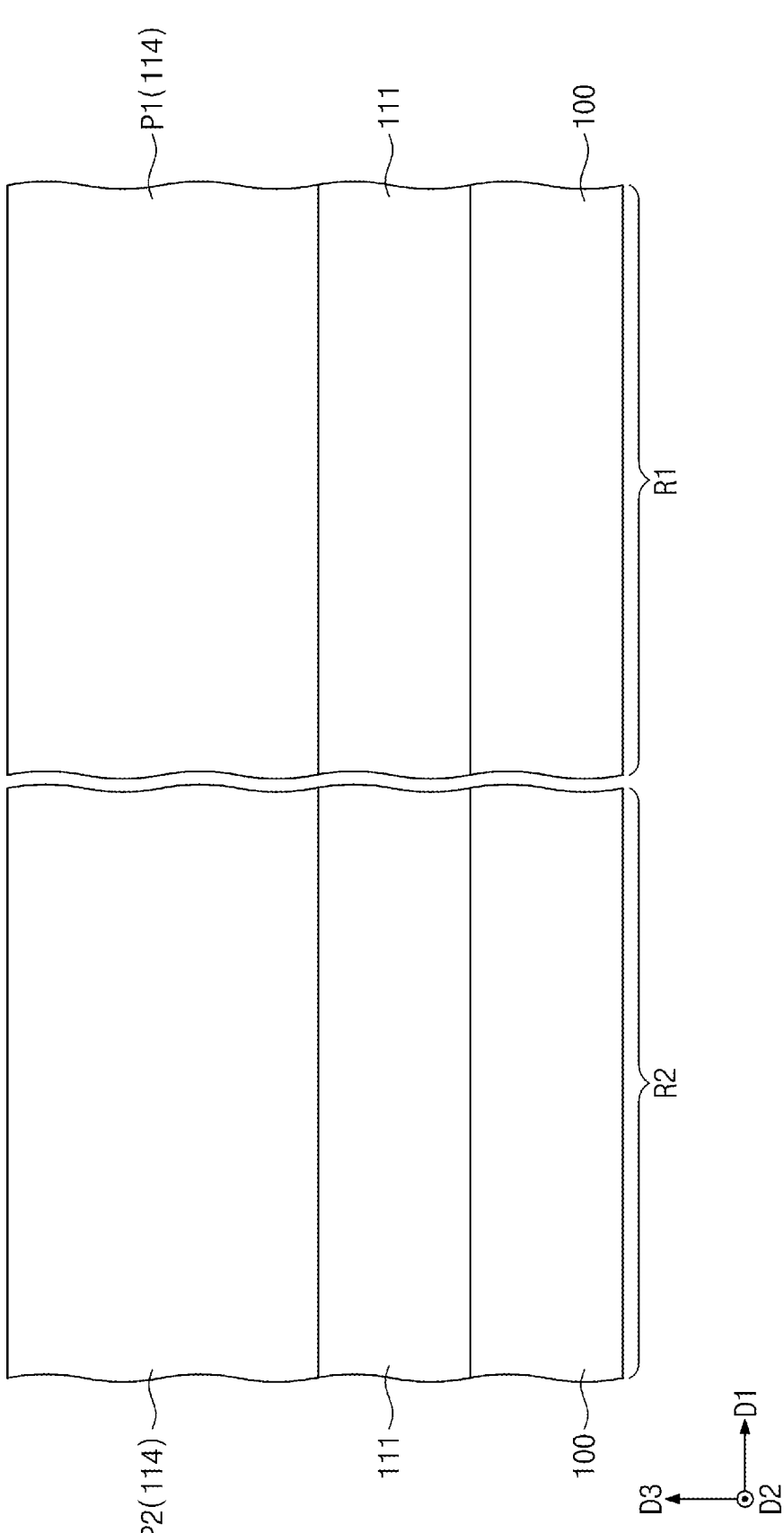
FIGS. 2A, 2B, 2C, and 2D illustrate cross-sectional views showing a method of fabricating the semiconductor device according to FIGS. 1A and 1B.

Referring to FIG. 2A, a substrate 100 may be provided. A lower dielectric layer 111 may be formed on the substrate 100. A preliminary dielectric layer 114 may be formed on the lower dielectric layer 111. In some embodiments, the preliminary dielectric layer 114 may include the same material as that of the lower dielectric layer 111, and the preliminary dielectric layer 114 and the lower dielectric layer 111 may be connected to constitute a single unitary structure with no boundary therebetween.

The preliminary dielectric layer 114 may include a first section P1 in the first region R1 and a second section P2 in the second region R2. The first section P1 and the second section P2 may be located at the same level. In some embodiments, the first section P1 and the second section P2 may be continuously connected into a single unitary structure with no boundary therebetween. In some embodiments, the first section P1 and the second section P2 may be contiguous. In some embodiments, the first section P1 and the second section P2 may be provided therebetween with a boundary and thus may be distinguished from each other.

Figure 2B:
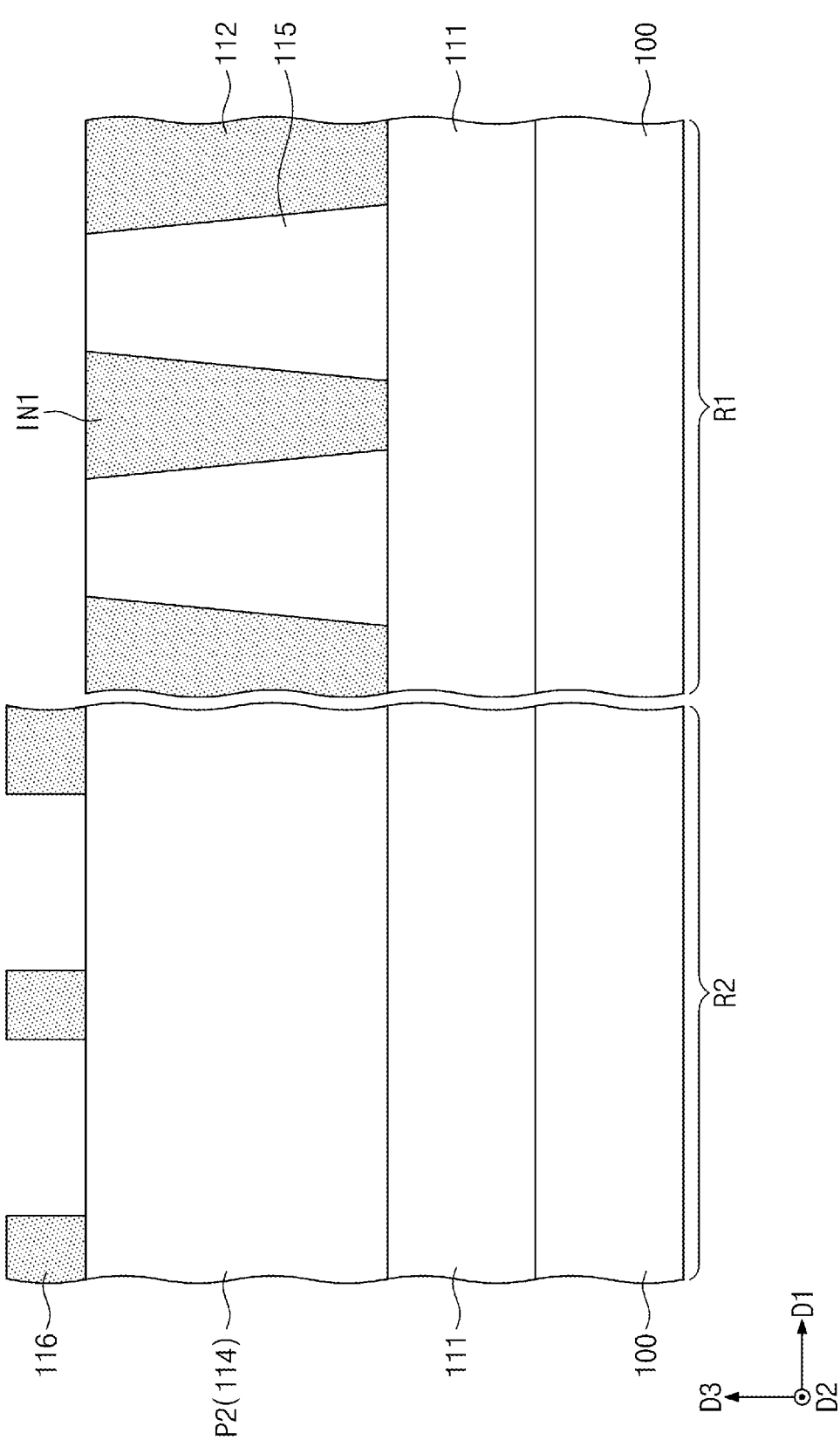

Referring to FIG. 2B, the first section P1 of the preliminary dielectric layer 114 may be etched. The first section P1 of the preliminary dielectric layer 114 may be etched to form dielectric patterns 115. The first section P1 of the preliminary dielectric layer 114 may have a portion that is not etched by the etching process, and the dielectric pattern 115 may be the non-etched portion of the first section P1 of the preliminary dielectric layer 114. The dielectric pattern 115 may have a width that increases with decreasing distance from the substrate 100.

A first dielectric layer 112 may be formed to surround the dielectric pattern 115. The first dielectric layer 112 may at least partially fill an empty space that is formed by etching the first section P1 of the preliminary dielectric layer 114. The first dielectric layer 112 may include a dielectric material having an etch selectivity with respect to the dielectric pattern 115. For example, the first dielectric layer 112 may include nitride or carbonitride, and the dielectric pattern 115 may include oxide. The first dielectric layer 112 may include a first intervention IN1 interposed between the dielectric patterns 115.

A mask pattern 116 may be formed on the second section P2 of the preliminary dielectric layer 114. In some embodiments, the mask pattern 116 may be located at a higher level than that of the first dielectric layer 112. The formation of the mask pattern 116 may include forming a mask layer on the second section P2 of the preliminary dielectric layer 114, and patterning the mask layer to form the mask pattern 116. The mask pattern 116 may include a material having an etch selectivity with respect to the second section P2 of the preliminary dielectric layer 114. For example, the mask pattern 116 may include nitride or carbonitride, and the second section P2 of the preliminary dielectric layer 114 may include oxide. In some embodiments, the mask pattern 116 may include the same material as that of the first dielectric layer 112.

Figure 2C:
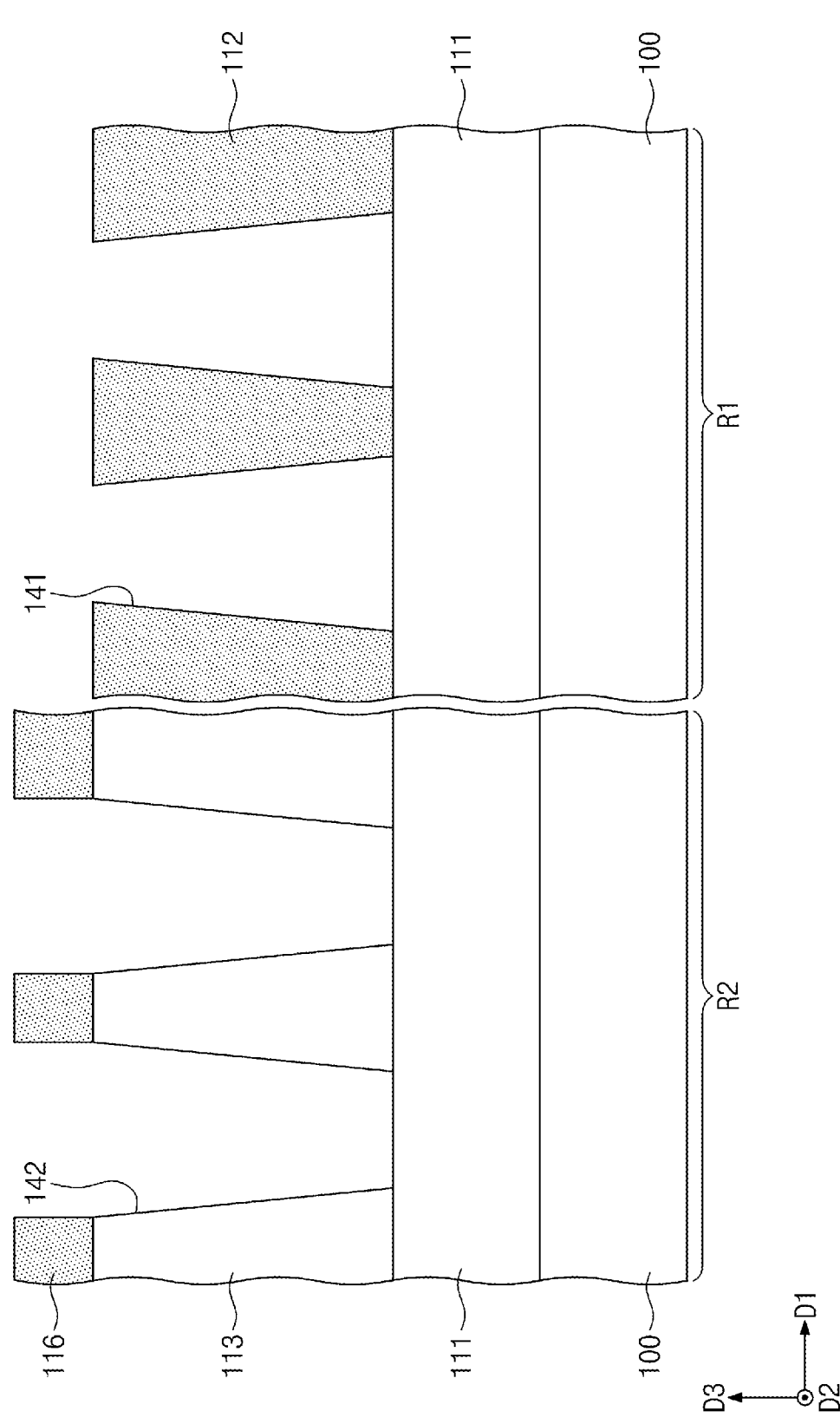

Referring to FIG. 2C, the mask pattern 116 and the first dielectric layer 112 may be used as an etching mask to perform an etching process. The etching process may etch the dielectric patterns 115 and the second section P2 of the preliminary dielectric layer 114. The etching process may remove the dielectric patterns 115 and may form first spaces 141 surrounded by the first dielectric layer 112. The first spaces 141 may expose the lower dielectric layer 111. The etching process may form second spaces 142 surrounded by the second section P2 of the preliminary dielectric layer 114. The second spaces 142 may expose the lower dielectric layer 111. A second dielectric layer 113 may be defined to indicate the etched second section P2 of the preliminary dielectric layer 114.

Figure 2D:
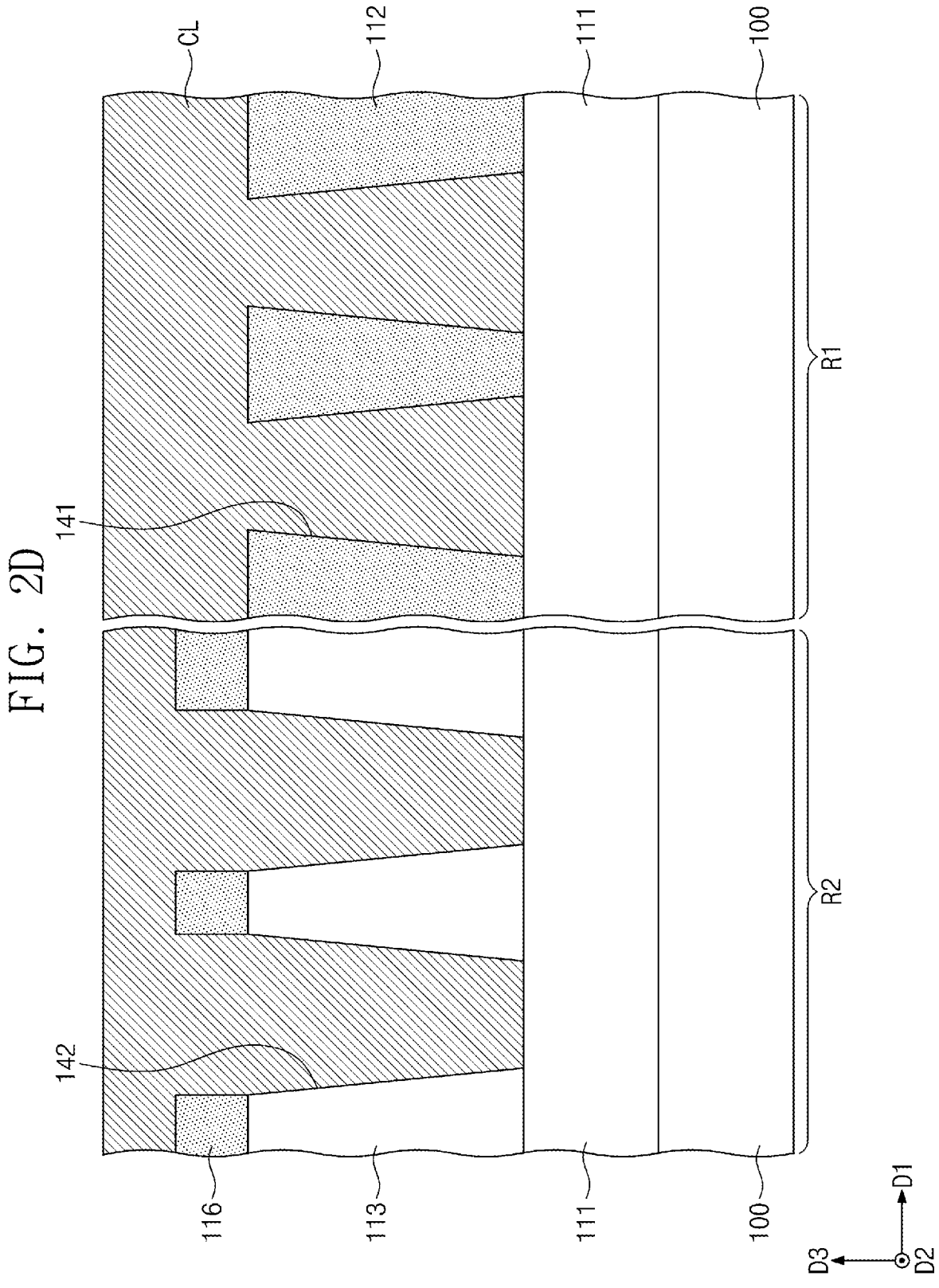

Referring to FIG. 2D, a conductive layer CL may be formed. The conductive layer CL may include a conductive material. The conductive layer CL may at least partially fill the first spaces 141 and the second spaces 142. The conductive layer CL may cover the mask pattern 116, the first dielectric layer 112, and the second dielectric layer 113.

Referring to FIG. 1B, a process may be performed to remove the mask pattern 116 and an upper portion of the conductive layer CL. For example, the mask pattern 116 and the upper portion of the conductive layer CL may be removed by a chemical mechanical polishing (CMP) process. The upper portion of the conductive layer CL may be removed, such that the conductive layer CL may be divided into first and second conductive structures 120 and 130.

In a method of fabricating a semiconductor device according to some embodiments, the first and second conductive structures 120 and 130 having different shapes and sizes may be respectively formed on the first and second regions R1 and R2 that are different from each other, which may result in an optimization of electrical properties of the semiconductor device.

Figure 3:
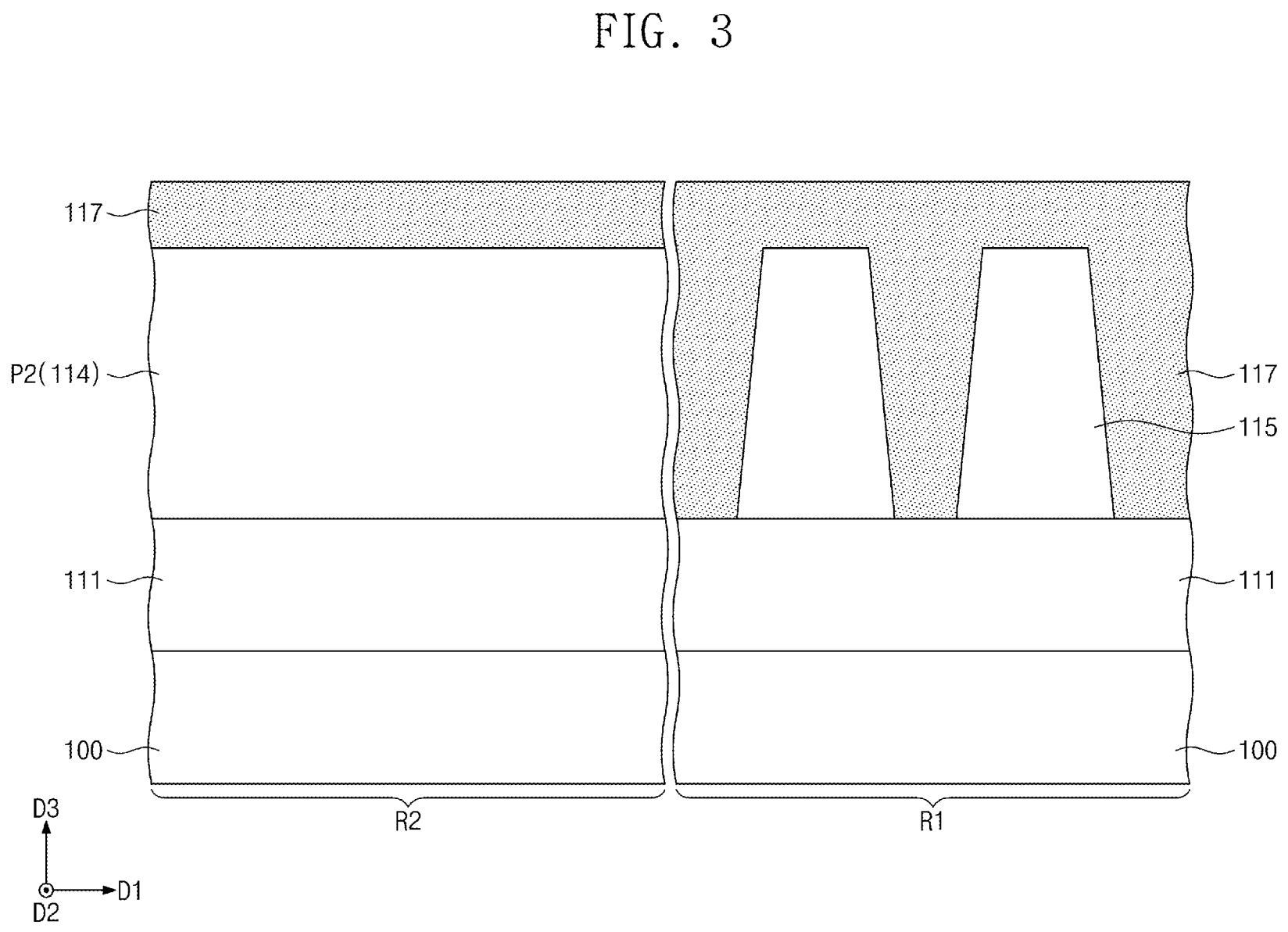

FIG. 3 illustrates a cross-sectional view showing a method of fabricating a semiconductor device according to some embodiments.

Referring to FIG. 3, similar to the description of FIG. 2A, a preliminary dielectric layer 114 may be formed which includes the substrate 100, the lower dielectric layer 111, the first section P1, and the second section P2. The first section P1 of the preliminary dielectric layer 114 may be etched to form dielectric patterns 115.

A mask layer 117 may be formed to cover the dielectric patterns 115 and the second section P2 of the preliminary dielectric layer 114. The mask layer 117 may at least partially fill an empty space that is formed by etching the first section P1 of the preliminary dielectric layer 114. The mask layer 117 may extend from the second region R2 to the first region R1.

The mask layer 117 may be patterned to form a mask pattern 116 and a first dielectric layer 112 that are similar to those discussed with reference to FIG. 2B. In some embodiments, a portion of the mask layer 117 in the first region R1 may be patterned simultaneously with a portion of the mask layer 117 in the second region R2, and the first dielectric layer 112 may be formed in the first region R1 simultaneously with the mask pattern 116 in the second region R2. In some embodiments, a portion of the mask layer 117 in the first region R1 may be patterned independently of a portion of the mask layer 117 in the second region R2, and the first dielectric layer 112 may be formed in the first region R1 independently of the mask pattern 116 in the second region R2. For example, a portion of the mask layer 117 in the first region R1 may be patterned to form the first dielectric layer 112 and thereafter a portion of the mask layer 117 in the second region R2 may be patterned to form the mask pattern 116.

Similar to the description of FIGS. 1B, 2C, and 2D, a second dielectric layer 113 may be formed, and the first and second conductive structures 120 and 130 may be formed.

Figure 4A:
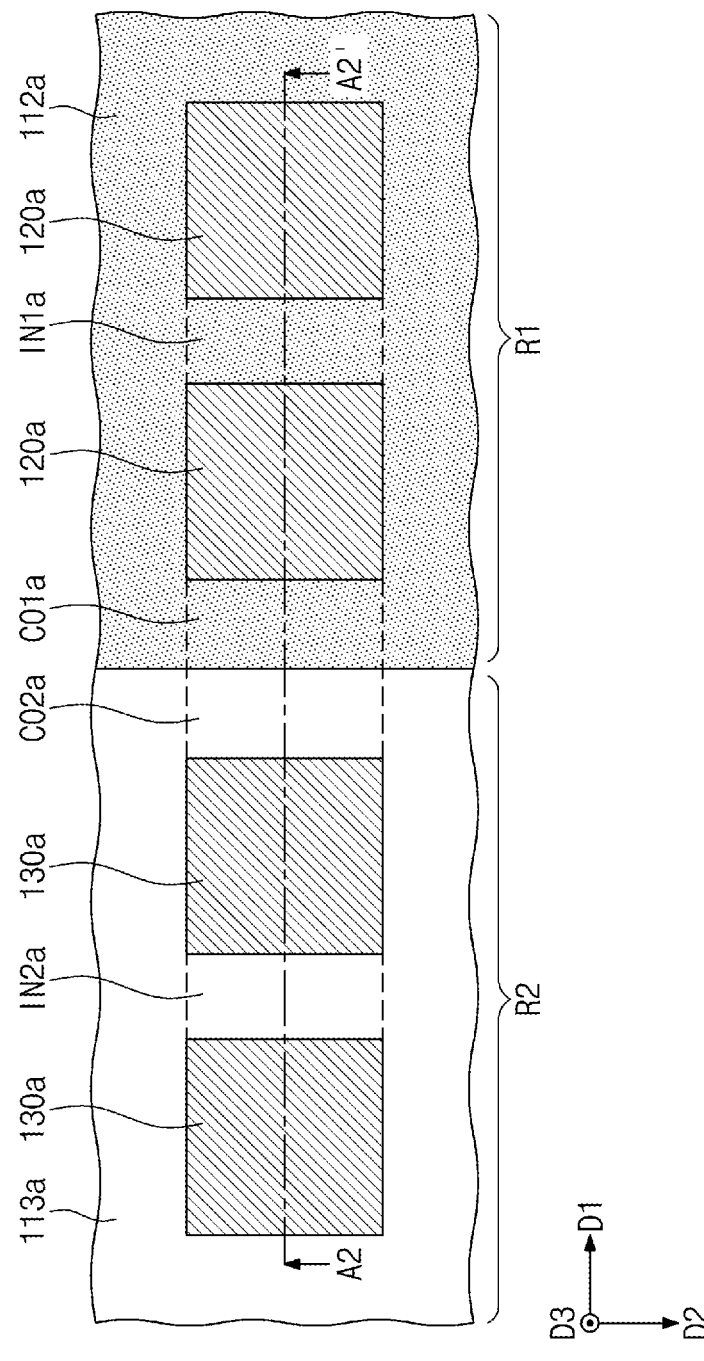
FIG. 4A illustrates a plan view showing a semiconductor device according to some embodiments.
Figure 4B:
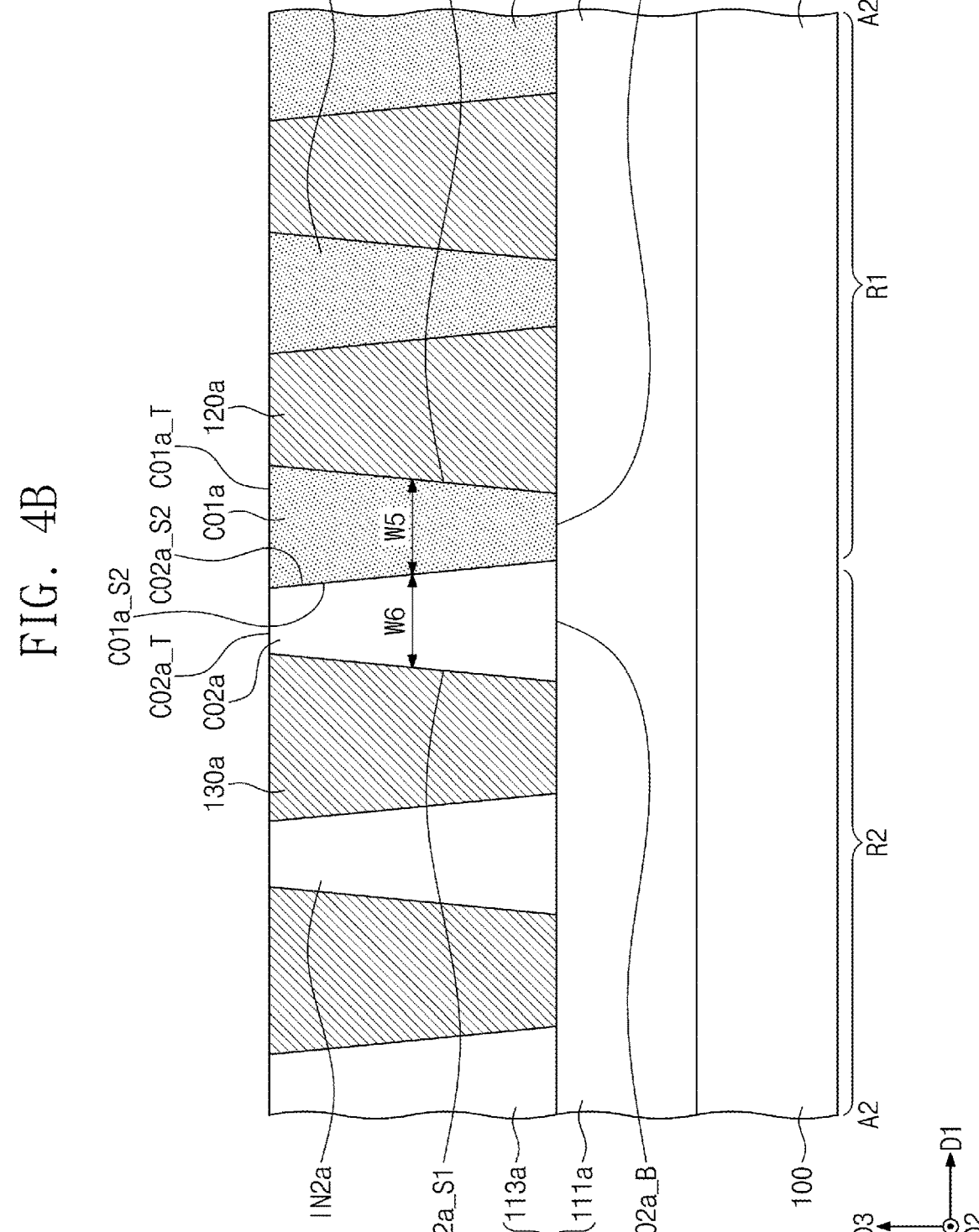
FIG. 4B illustrates a cross-sectional view taken along line A2-A2' of FIG. 4A.

FIG. 4A illustrates a plan view showing a semiconductor device according to some embodiments. FIG. 4B illustrates a cross-sectional view taken along line A2-A2' of FIG. 4A.

Referring to FIGS. 4A and 4B, a semiconductor device may include a substrate 100a, a dielectric structure 110a on the substrate 100a, first conductive structures 120a in the dielectric structure 110a, and second conductive structures 130a in the dielectric structure 110a.

The dielectric structure 110a may include a lower dielectric layer 111a on the substrate 100a, a first dielectric layer 112a on the lower dielectric layer 111a, and a second dielectric layer 113a on the lower dielectric layer 111a.

The first dielectric layer 112a may include a first intervention IN1a and a first connector CO1a. The first dielectric layer 112a may have a portion between one of the first conductive structures 120a and an adjacent one or a proximate one of the second conductive structures 130a, and the first connector CO1a may be the portion of the first dielectric layer 112a.

The second dielectric layer 113a may include a second intervention IN2a and a second connector CO2a. The second dielectric layer 113a may have a portion between one of the first conductive structures 120a and the adjacent one or the proximate one of the second conductive structures 130a, and the second connector CO2a may be the portion of the second dielectric layer 113a.

The first connector CO1a and the second connector CO2a may be provided between a first conductive structure 120a and a second conductive structure 130a that are adjacent to each other or proximate with each other. The first connector CO1a and the second connector CO2a may be in contact with each other. Each of the first connector CO1a and the second connector CO2a may have sidewalls that are inclined. In some embodiments, each of the first connector CO1a and the second connector CO2a may have sidewalls that are non-perpendicular with a bottom surface of the dielectric structure 110a (e.g., a bottom surface of the lower dielectric layer 111a). The first connector CO1a may have a first sidewall CO1a_S1 that is in contact with the first conductive structure 120a, and the first connector CO1a may also have a second sidewall CO1a_S2 that is opposite to the first sidewall CO1a_S1 and in contact with the second connector CO2a. The second connector CO2a may have a first sidewall CO2a_S1 that is in contact with the second conductive structure 130a, and the second connector CO2a may also have a second sidewall CO2a_S2 that is opposite to the first sidewall CO2a_S1 and in contact with the second sidewall CO1a_S2 of the first connector CO1a.

The first connector CO1a may have a width that decreases with decreasing distance from the substrate 100a and the lower dielectric layer 111a. Stated differently, the first connector CO1a may have a width that increases with increasing distance from the substrate 100a and the lower dielectric layer 111a. For example, a width W5 in the first direction D1 of the first connector CO1a may decrease with decreasing distance from the substrate 100a and the lower dielectric layer 111a. The width of the first connector CO1a may decrease in a direction from a top surface CO1a_T toward a bottom surface CO1a_B of the first connector CO1a. The first connector CO1a may have a width at the top surface CO1a_T that is greater than a width at the bottom surface CO1a_B.

The second connector CO2a may have a width that decreases with increasing distance from the substrate 100a and the lower dielectric layer 111a. Stated differently, the second connector CO2a may have a width that increases with decreasing distance from the substrate 100a and the lower dielectric layer 111a. For example, a width W6 in the first direction D1 of the second connector CO2a may increase with decreasing distance from the substrate 100a and the lower dielectric layer 111a. The width of the second connector CO2a may increase in a direction from a top surface CO2a_T toward a bottom surface CO2a_B of the second connector CO2a. The second connector CO2a may have a width at the top surface CO2a_T that is less than a width at the bottom surface CO2a_B.

The first conductive structure 120a may be provided between the first connector CO1a and the first intervention IN1a. The second connective structure 130a may be provided between the second connector CO2a and the second intervention IN2a.

Figure 5:
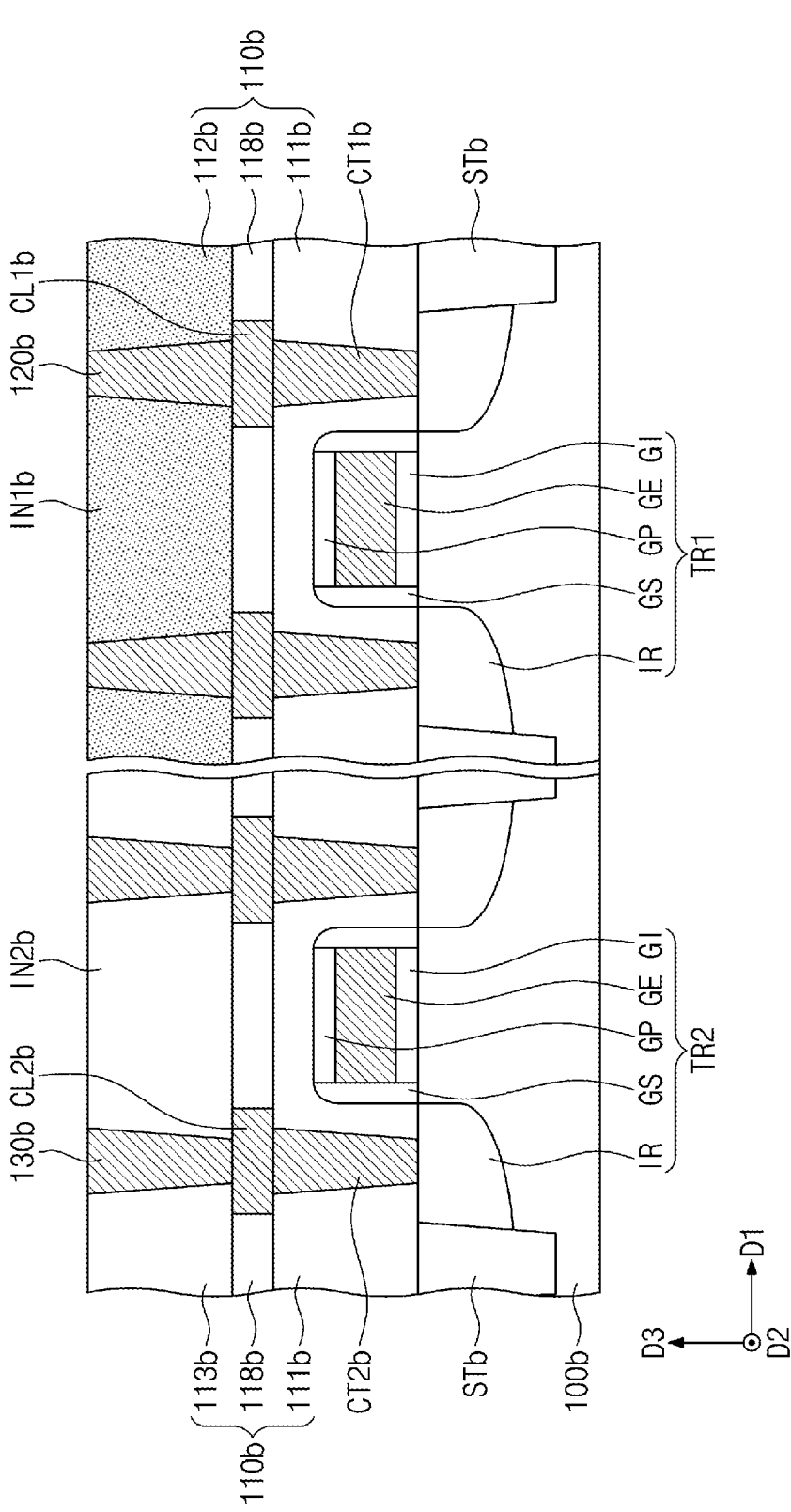
FIG. 5 illustrates a cross-sectional view showing a semiconductor device according to some embodiments.

FIG. 5 illustrates a cross-sectional view showing a semiconductor device according to some embodiments.

Referring to FIG. 5, a semiconductor device may include a substrate 100b. A dielectric structure 110b may be provided on the substrate 100b. The dielectric structure 110b may include a first lower dielectric layer 111b that is on (and in some embodiments, covers) the substrate 100b, a second lower dielectric layer 118b on the first lower dielectric layer 111b, and a first dielectric layer 112b and a second dielectric layer 113b that are on the second lower dielectric layer 118b.

A first transistor TR1 and a second transistor TR2 may be provided between the substrate 100b and a portion of the dielectric structure 110b. For example, the first and second transistors TR1 and TR2 may be cell transistors and/or peripheral transistors that constitute memory devices, logic devices, and/or image sensor devices. In some embodiments, the first and second transistors TR1 and TR2 may be covered with the first lower dielectric layer 111b of the dielectric structure 110b. The first and second transistors TR1 and TR2 may have different sizes and/or functions.

Each of the first and second transistors TR1 and TR2 may include impurity regions IR, and may also include a channel and a gate structure that are between the impurity regions IR. The gate structure may include gate spacers GS, and may also include a gate dielectric layer GI, a gate electrode GE, and a gate capping layer GP that are between the gate spacers GS. The impurity regions IR may be formed by implanting the substrate 100b with impurities. A dielectric material may be included in the gate spacers GS, the gate dielectric layer GI, and the gate capping layer GP. The gate electrode GE may include a conductive material. Other structures of the first and second transistors TR1 and TR2 are contemplated, and no limitation is imposed on the structures of the first and second transistors TR1 and TR2. In some embodiments, the first and second transistors TR1 and TR2 may each include a buried gate electrode. In some embodiments, the first and second transistors TR1 and TR2 may each include a vertical gate electrode. In some embodiments, the first and second transistors TR1 and TR2 may each include a gate-all-around structure.

The substrate 100b may be provided with device isolation layers STb therein. The first and second transistors TR1 and TR2 may be provided between the device isolation layers STb. The device isolation layers STb may include a dielectric material.

First contacts CT1b and second contacts CT2b may be provided in the first lower dielectric layer 111b of the dielectric structure 110b. The first contacts CT1b may be connected to the first transistor TR1, and the second contacts CT2b may be connected to the second transistor TR2. The first and second contacts CT1b and CT2b may include a conductive material.

First conductive lines CL1b and second conductive lines CL2b may be provided in the second lower dielectric layer 118b of the dielectric structure 110b. The first conductive line CL1b may be connected to the first contact CT1b, and the second conductive line CL2b may be connected to the second contact CT2b. The first and second conductive lines CL1b and CL2b may include a conductive material.

The first dielectric layer 112b may be provided with first conductive structures 120b therein. The first conductive structures 120b may have widths that increase with decreasing distance from the substrate 100b or from a top surface of the substrate 100b. The second dielectric layer 113b may be provided with second conductive structures 130*b* therein. The second conductive structures 130*b* may have widths that decrease with decreasing distance from the substrate 100*b* or from the top surface of the substrate 100*b*. The first dielectric layer 112*b* may include a first intervention IN1*b* between the first conductive structures 120*b*. The second dielectric layer 113*b* may include a second intervention IN2*b* between the second conductive structures 130*b*. The first dielectric layer 112*b* and the second dielectric layer 113*b* may include dielectric materials that are different from each other.

Figure 6A:
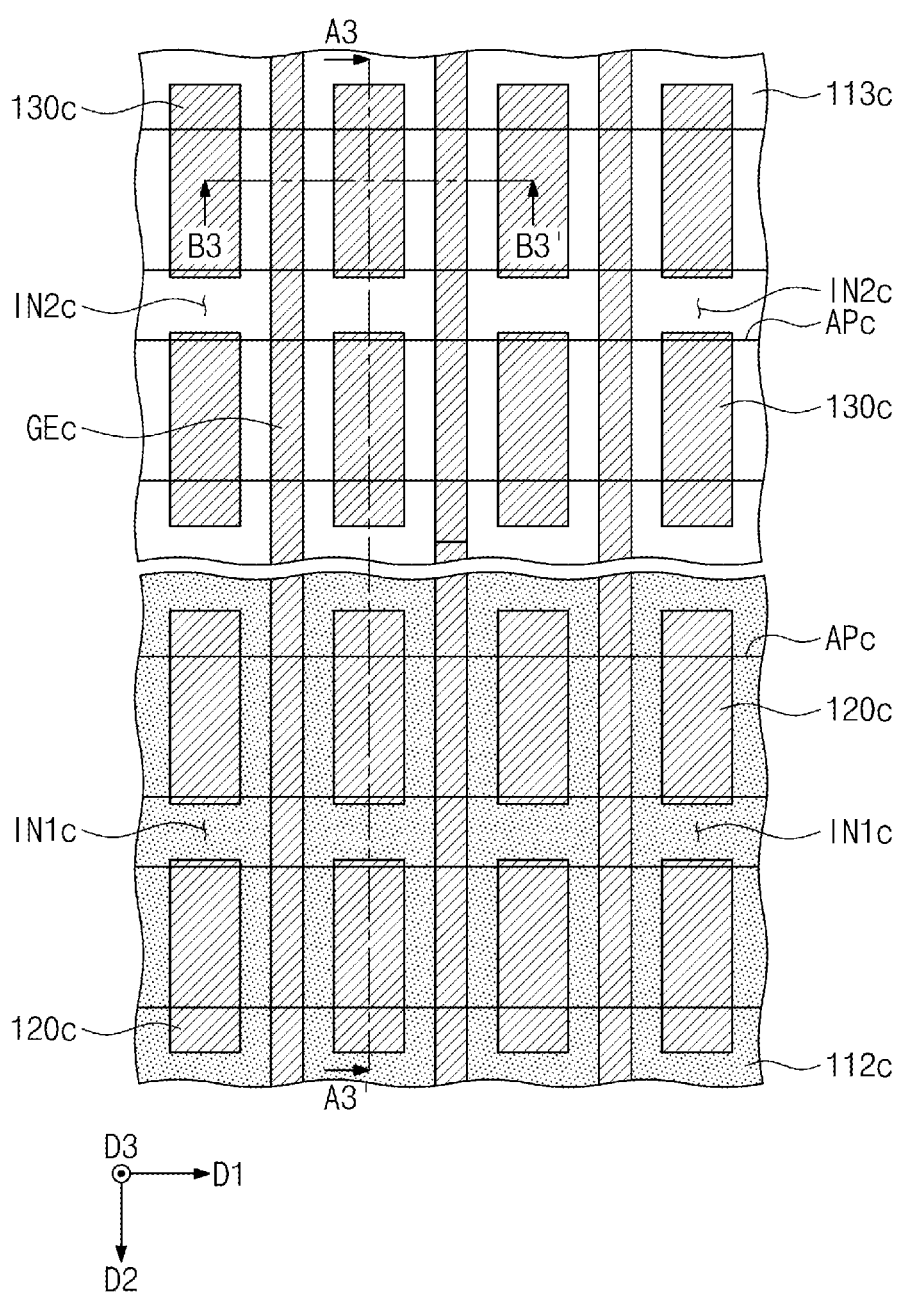
FIG. 6A illustrates a plan view showing a semiconductor device according to some embodiments.
Figure 6B:
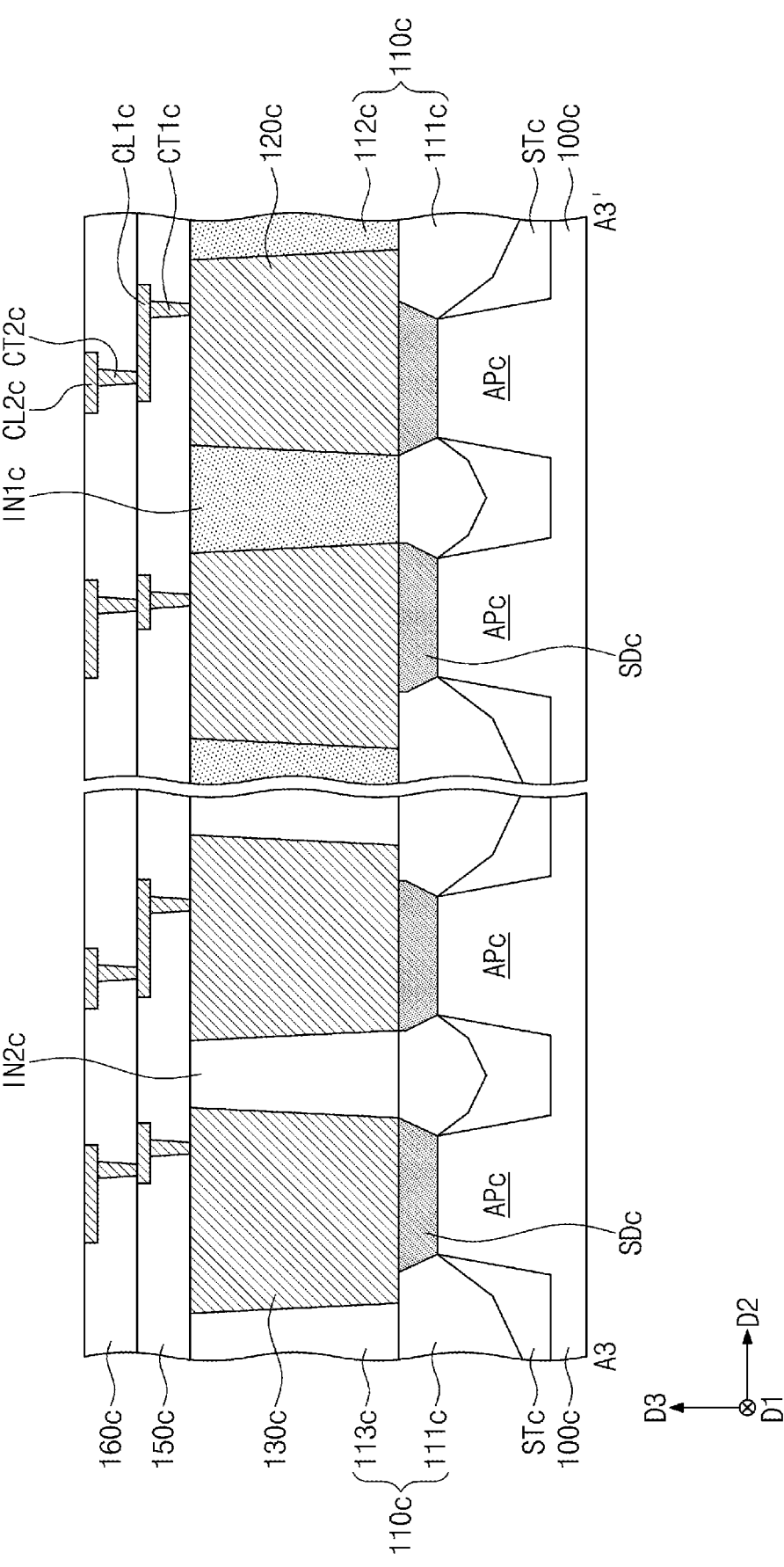
FIG. 6B illustrates a cross-sectional view taken along line A3-A3' of FIG. 6A.
Figure 6C:
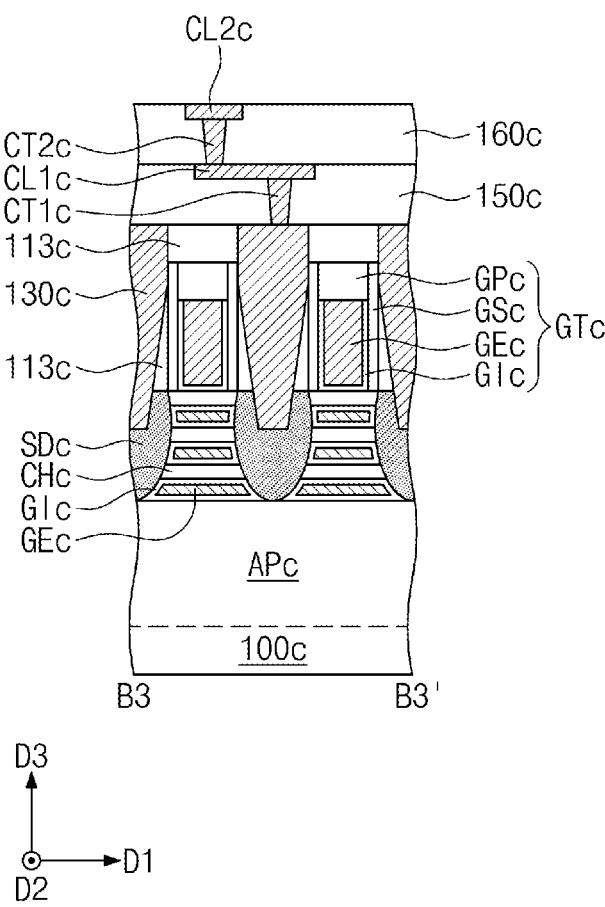
FIG. 6C illustrates a cross-sectional view taken along line B3-B3' of FIG. 6A.

FIG. 6A illustrates a plan view showing a semiconductor device according to some embodiments. FIG. 6B illustrates a cross-sectional view taken along line A3-A3' of FIG. 6A. FIG. 6C illustrates a cross-sectional view taken along line B3-B3' of FIG. 6A.

Referring to FIGS. 6A, 6B, and 6C, a semiconductor device may include a substrate 100*c*.

The substrate 100*c* may include active patterns APc. Each of the active patterns APc may protrude or extend in height in the third direction D3. The active patterns APc may be portions of the substrate 100*c*. The active patterns APc may extend in length in the first direction D1.

A device isolation layer STc may be provided on the substrate 100*c*. The device isolation layer STc may include a dielectric material. For example, the device isolation layer STc may include oxide. The active patterns APc may extend between the device isolation layer STc. The device isolation layer STc may define the active patterns APc, for example in the second direction D2.

Source/drain patterns SDc may be provided on the active patterns APc. In some embodiments, the source/drain patterns SDc may include p-type impurity regions and n-type impurity regions. Channel CHc arranged in the third direction D3 may be provided between the source/drain patterns SDc adjacent or proximate to each other in the first direction D1. The channels CHc may be portions of the active pattern APc. The active pattern APc may have a portion interposed between the source/drain patterns SDc adjacent to each other in the first direction D1, and the channel CHc may be or may include the interposed portion of the active pattern APc.

The source/drain patterns SDc may be epitaxial patterns formed by a selective epitaxial growth process. The source/drain patterns SDc may include a semiconductor material.

Gate structures GTc may be provided on the active patterns APc. The gate structures GTc may extend in the second direction D2. The gate structures GTc may be spaced apart from each other in the first direction D1. Each of the gate structures GTc may cover top and bottom surfaces of the channels CHc that are arranged in the third direction D3.

Each of the gate structures GTc may include a gate electrode GEc, a gate dielectric layer GIc, gate spacers GSc, and a gate capping layer GPc. The gate electrode GEc may include a conductive material. The gate electrode GEc may include a portion that is interposed between the channels CHc adjacent to each other in the third direction D3. The gate spacers GSc may be provided on opposite sides (in the first direction D1) of a portion of the gate electrode GEc. The gate spacers GSc may include a dielectric material. The gate dielectric layer GIc may include, for example, a portion interposed between the gate electrode GEc and the channel CHc and a portion interposed between the gate electrode GEc and the gate spacer GSc. The gate dielectric layer GIc may separate the gate electrode GEc from the channel CHc. In some embodiments, the gate dielectric layer GIc may be between the gate electrode GEc and the source/drain patterns SDc. The gate dielectric layer GIc may include a dielectric material. The gate capping layer GPc may cover a top surface of the gate electrode GEc. The gate capping layer GPc may include a dielectric material.

A dielectric structure 110*c* may be provided on the source/drain patterns SDc and the gate structures GTc. The dielectric structure 110*c* may include a lower dielectric layer 111*c*, a first dielectric layer 112*c*, and a second dielectric layer 113*c*. The lower dielectric layer 111*c* may be provided on the device isolation layer STc. The first dielectric layer 112*c* and the second dielectric layer 113*c* may be provided on the lower dielectric layer 111*c*. The first dielectric layer 112*c* and the second dielectric layer 113*c* may include dielectric materials that are different from each other. The first dielectric layer 112*c* may include a dielectric layer having an etch selectivity with respect to the second dielectric layer 113*c*.

First conductive structures 120*c* may be provided in the first dielectric layer 112*c* of the dielectric structure 110*c*. The first conductive structures 120*c* may be active contacts. The first conductive structures 120*c* may be connected to the source/drain patterns SDc. The first conductive structures 120*c* may have widths (in the second direction D2) that increase with decreasing distance from the substrate 100*c* or from a top surface of the substrate 100*c*. The first dielectric layer 112*c* may include a first intervention IN1*c* between the first conductive structures 120*c* adjacent or proximate to each other. The first intervention IN1*c* may have a width that decreases with decreasing distance from the substrate 100*c* or from the top surface of the substrate 100*c*. A portion of the first conductive structure 120*c* may be provided in the source/drain pattern SDc. Portions of the source/drain pattern SDc may be correspondingly on opposite sides (in the first direction D1) of a portion of the first conductive structure 120*c*. A portion of the source/drain pattern SDc may be removed in or during forming the first conductive structure 120*c*. A portion of the first dielectric layer 112*c* may be provided between the first conductive structure 120*c* and the gate structure GTc.

Second conductive structures 130*c* may be provided in the second dielectric layer 113*c* of the dielectric structure 110*c*. The second conductive structures 130*c* may be active contacts. The second conductive structures 130*c* may be connected to the source/drain pattern SDc. The second conductive structure 130*c* may have a width (in the second direction D2) that decreases with decreasing distance from the substrate 100*c* or from the top surface of the substrate 100*c*. The second dielectric layer 113*c* may include a second intervention IN2*c* between the second conductive structures 130*c* adjacent or proximate to each other. The second intervention IN2*c* may have a width that increases with decreasing distance from the substrate 100*c* or from the top surface of the substrate 100*c*. As seen in FIG. 6C, a portion of the second conductive structure 130*c* may be provided in the source/drain pattern SDc. Portions of the source/drain pattern SDc may be correspondingly on opposite sides (in the first direction D1) of a portion of the second conductive structure 130*c*. A portion of the source/drain pattern SDc may be removed in or during forming the second conductive structure 130*c*. A portion of the second dielectric layer 113*c* may be provided between the second conductive structure 130*c* and the gate structure GTc.

A first upper dielectric layer 150*c* may be provided on the dielectric structure 110*c*, the first conductive structures 120*c*, and the second conductive structures 130*c*, and in some embodiments the first upper dielectric layer 150*c* may at least partially cover the dielectric structure 110*c*, the first conductive structures 120*c*, and the second conductive structures 130*c*. The first upper dielectric layer 150*c* may include a dielectric material. The first upper dielectric layer 150*c* may be provided therein with first contacts CT1*c* and first conductive lines CL1*c*. Each first contact CT1*c* may be connected to one of the first conductive structures 120*c* or one of the second conductive structures 130*c*. Each first conductive line CL1*c* may be connected to at least one of the first contacts CT1*c*. The first contacts CT and the first conductive lines CL may include a conductive material.

A second upper dielectric layer 160*c* may be provided on the first upper dielectric layer 150*c*, and in some embodiments the second upper dielectric layer 160*c* may at least partially cover the first upper dielectric layer 150*c*. The second upper dielectric layer 160*c* may include a dielectric material. The second upper dielectric layer 160*c* may be provided therein with second contacts CT2*c* and second conductive lines CL2*c*. The second contacts CT2*c* may be connected to the first conductive lines CL1*c*. The second conductive lines CL2*c* may be connected to the second contacts CT2*c*. The second contacts CT2*c* and the second conductive lines CL2*c* may include a conductive material.

Figure 7:
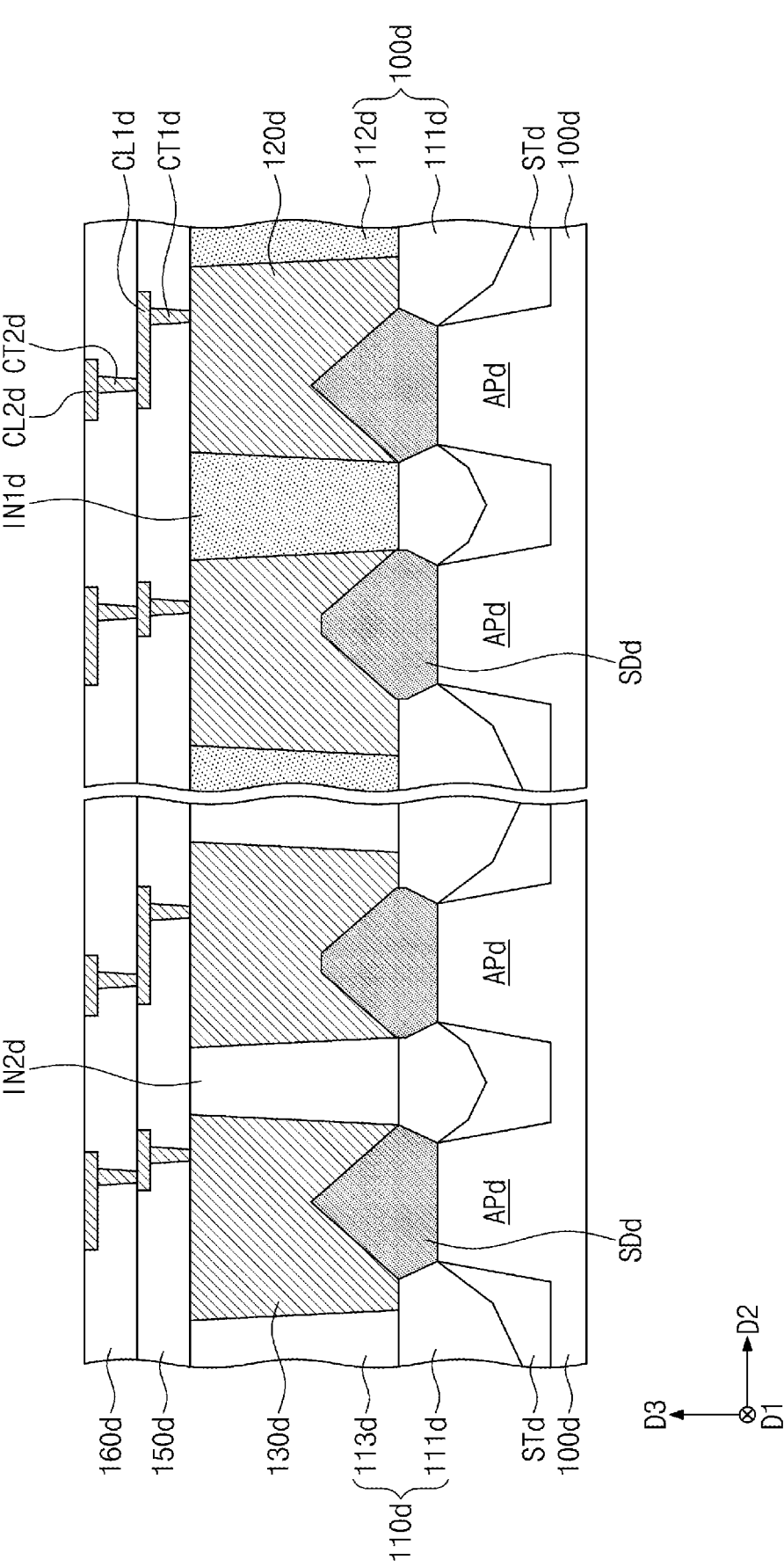
FIG. 7 illustrates a cross-sectional view showing a semiconductor device according to some embodiments.

FIG. 7 illustrates a cross-sectional view showing a semiconductor device according to some embodiments.

Referring to FIG. 7, a semiconductor device may include a substrate 100*d* including active patterns APd, a device isolation layer STd, a dielectric structure 110*d*, source/drain patterns SDd, gate structures (not shown in FIG. 7), first conductive structures 120*d*, second conductive structures 130*d*, a first upper dielectric layer 150*d*, a second upper dielectric layer 160*d*, first contacts CT1*d*, first conductive lines CL1*d*, second contacts CT2*d*, and second conductive lines CL2*d*.

The dielectric structure 110*d* may include a lower dielectric layer 111*d* on the device isolation layer STd, and may also include a first dielectric layer 112*d* and a second dielectric layer 113*d* on the lower dielectric layer 111*d*. The first dielectric layer 112*d* may include a first intervention IN1*d* between first conductive structures 120*d* adjacent or proximate to each other. The second dielectric layer 113*d* may include a second intervention IN2*d* between second conductive structures 130*d* adjacent or proximate to each other.

Portions of one of the first and second conductive structures 120*c* and 130*c* may be correspondingly on opposite sides (in the second direction D2) of the source/drain pattern SDd. The first conductive structure 120*c* and the second conductive structure 130*c* may be formed without removing a portion of the source/drain pattern SDd.

For semiconductor devices according to some embodiments of the present inventive concepts, as regions differing from each other may be provided thereon with conductive structures having different shapes and sizes, it may be possible to optimize electrical properties of the semiconductor device.

Although the present inventive concepts have been described in connection with the some embodiments thereof illustrated in the accompanying drawings, it will be understood by one of ordinary skill in the art that variations in form and detail may be made therein without departing from the scope of the present inventive concepts as defined by the appended claims. The above disclosed embodiments should thus be considered illustrative and not restrictive.

What is claimed is:

1. A semiconductor device, comprising:
a dielectric structure; and
first conductive structures and second conductive structures in the dielectric structure, wherein the dielectric structure includes a first dielectric layer that surrounds the first conductive structures and a second dielectric layer that surrounds the second conductive structures, wherein the first dielectric layer includes a first intervention in contact with and between the first conductive structures, wherein the second dielectric layer includes a second intervention in contact with and between the second conductive structures, wherein a width in a first direction of the first intervention decreases in a second direction from a top surface of the first intervention toward a bottom surface of the first intervention, wherein a width in the first direction of the second intervention increases in the second direction from a top surface of the second intervention toward a bottom surface of the second intervention, wherein the first dielectric layer and the second dielectric layer include different dielectric materials from each other, and wherein each of the first conductive structures are spaced apart from each of the second conductive structures along the first direction.

2. The semiconductor device of claim 1, wherein
the first dielectric layer includes a first dielectric material, and
the second dielectric layer includes a second dielectric material having an etch selectivity with respect to the first dielectric material.

3. The semiconductor device of claim 1, wherein
a width of each of the first conductive structures increases in the second direction from a top surface of each of the first conductive structures toward a bottom surface of the each of the first conductive structures, and
a width of each of the second conductive structures decreases in the second direction from a top surface of each of the second conductive structures toward a bottom surface of the each of the second conductive structures.

4. The semiconductor device of claim 1, wherein
the first conductive structures are spaced apart from the second conductive structures in the first direction, with one of the first conductive structures proximate to one of the second conductive structures,
the first dielectric layer further includes a first connector between the one of the first conductive structures and the proximate one of the second conductive structures, and
the second dielectric layer further includes a second connector between the one of the first conductive structures and the proximate one of the second conductive structures.

5. The semiconductor device of claim 4, wherein a width in the first direction of the first connector decreases in the second direction from a top surface of the first connector toward a bottom surface of the first connector.

6. The semiconductor device of claim 4, wherein a width in the first direction of the second connector increases in the second direction from a top surface of the first connector toward a bottom surface of the second connector.

7. The semiconductor device of claim 4, wherein
a sidewall of the first connector is in contact with a sidewall of the second connector, and
the sidewall of each of the first and second connectors is non-perpendicular with a bottom surface of the dielectric structure.

8. The semiconductor device of claim 1, wherein upper surfaces of each of the first dielectric layer, the second dielectric layer, the first conductive structures, and the second conductive structures are coplanar.

9. The semiconductor device of claim 1, wherein the first dielectric layer includes nitride or carbonitride, and the second dielectric layer includes oxide.

10. A semiconductor device, comprising:

a substrate;

a dielectric structure on the substrate; and first conductive structures and second conductive structures in the dielectric structure, wherein the dielectric structure includes a first dielectric layer that surrounds the first conductive structures and a second dielectric layer that surrounds the second conductive structures, wherein the first dielectric layer includes a first intervention between the first conductive structures, wherein the second dielectric layer includes a second intervention between the second conductive structures, wherein a width of the first intervention in a first direction decreases with decreasing distance from a top surface of the substrate, wherein a width of the second intervention in the first direction increases with decreasing distance from the top surface of the substrate, wherein the first dielectric layer and the second dielectric layer include different dielectric materials from each other, and wherein each of the first conductive structures are spaced apart from each of the second conductive structures along the first direction.

11. The semiconductor device of claim 10, wherein bottom surfaces of the first dielectric layer, the second dielectric layer, the first conductive structures, and the second conductive structures are coplanar with each other.

12. The semiconductor device of claim 10, wherein top surfaces of the first dielectric layer, the second dielectric layer, the first conductive structures, and the second conductive structures are coplanar with each other.

13. The semiconductor device of claim 10, wherein the first conductive structures and the second conductive structures are in direct contact with the top surface of the substrate.

14. The semiconductor device of claim 10, wherein the first conductive structures are spaced apart from the second conductive structures in the first direction, with one of the first conductive structures proximate to one of the second conductive structures, the first dielectric layer further includes a first connector between the one of the first conductive structures and the proximate one of the second conductive structures, and the second dielectric layer further includes a second connector between the one of the first conductive structures and the proximate one of the second conductive structures.

15. The semiconductor device of claim 14, wherein a width of the first connector in the first direction decreases with decreasing distance from the substrate, and a width of the second connector in the first direction increases with decreasing distance from the substrate.

16. The semiconductor device of claim 14, wherein a first sidewall of the first connector is in contact with the one of the first conductive structures, a second sidewall of the first connector is in contact with the second connector, and the first and second sidewalls of the first connector are non-perpendicular with a bottom surface of the dielectric structure.

17. The semiconductor device of claim 16, wherein a first sidewall of the second connector is in contact with the one of the second conductive structures, a second sidewall of the second connector is in contact with the second sidewall of the first connector, and the first and second sidewalls of the second connector are non-perpendicular with a bottom surface of the dielectric structure.

18. A semiconductor device, comprising:

a substrate that includes an active pattern;

a source/drain region on the active pattern;

a conductive structure connected to the source/drain region; and a dielectric structure that surrounds the conductive structure, wherein the dielectric structure includes a first dielectric layer and a second dielectric layer that include different dielectric materials from each other, wherein the conductive structure includes first conductive structures in the first dielectric layer and second conductive structures in the second dielectric layer, wherein the first dielectric layer includes a first separation structure between the first conductive structures, wherein the second dielectric layer includes a second separation structure between the second conductive structures, wherein a width in a first direction of each of the first conductive structures increases with decreasing distance from the substrate, wherein a width in the first direction of each of the second conductive structures decreases with decreasing distance from the substrate, wherein a width in the first direction of the first separation structure decreases with decreasing distance from the substrate, wherein a width in the first direction of the second separation structure increases with decreasing distance from the substrate, and wherein each of the first conductive structures are spaced apart from each of the second conductive structures along the first direction.

19. The semiconductor device of claim 18, wherein the first dielectric layer includes a dielectric material having an etch selectivity with respect to the second dielectric layer.

20. The semiconductor device of claim 19, wherein lower surfaces of the first dielectric layer and the second dielectric layer are coplanar.

* * * * *